United States Patent [19]

Izumi et al.

[11] Patent Number: 4,510,387
[45] Date of Patent: Apr. 9, 1985

[54] ION MICRO-ANALYSIS

[75] Inventors: Eiichi Izumi, Takahagi; Hifumi Tamura, Hachioji, both of Japan

[73] Assignee: Hitachi, Ltd., Tokyo, Japan

[21] Appl. No.: 435,728

[22] Filed: Oct. 20, 1982

[30] Foreign Application Priority Data

Oct. 23, 1981 [JP] Japan .............................. 56-170585

[51] Int. Cl.³ .................. H01J 37/256; G01N 23/225
[52] U.S. Cl. .................................... 250/309; 250/306; 250/307
[58] Field of Search ........................ 250/309, 307, 306

[56] References Cited

U.S. PATENT DOCUMENTS 3,881,108 4/1975 Kondo et al. ...................... 250/307
3,894,233 7/1975 Tamura et al. ..................... 250/307

OTHER PUBLICATIONS

Wilson et al., *Ion Beams*, 1973, pp. 261-277.
Evans, "Secondary Ion Mass Analysis ...", *Analytical Chemistry*, vol. 44, No. 13, Nov. 1972, pp. 67A-80A.

*Primary Examiner*—Alfred E. Smith
*Assistant Examiner*—Jack I. Berman
*Attorney, Agent, or Firm*—Antonelli, Terry & Wands

[57] ABSTRACT

In ion micro-analysis, intensity of at least one species of secondary ions is monitored, and a reference etching time required for etching an implanted depth of primary ions is determined from a profile of a secondary ion intensity signal. Analysis time is graduated on the basis of the reference etching time to represent an analysis signal with the scale of the depth. The primary ions are non-volatile and may be active ions which react with a specimen or metal ions. The analyzed depth can be found during the analysis to prevent unwanted analysis and assure rapid data processing.

20 Claims, 11 Drawing Figures

ION MICRO-ANALYSIS

BACKGROUND OF THE INVENTION

1. Field of the Invention

This invention relates to ion micro-analysis especially capable of measuring and indicating the analyzed depth during the analysis.

2. Description of the Prior Art

In ion micro-analysis, the surface of a specimen is bombarded with a primary ion beam and secondary ions generated thereby are mass-analyzed. Accordingly, through ion micro-analysis, composition of the specimen, content of specific atomic (molecular) species and the like at the location on which the primary ion beam is bombarded can be determined. When the specimen surface is scanned with the primary ion beam, the distribution of specific secondary ions in the specimen surface can be determined. Further when the same area of a solid specimen is successively analyzed, the specimen is sputtered (etched) and the analysis gradually proceeds to deeper locations so that distribution of specific secondary ions in the direction of depth can be determined. Therefore, ion micro-analysis has versatility especially in analysis of small quantities and analysis in the direction of depth, and it is highlighted in the field of semiconductor technology and metallography. For general knowledge of the ion micro-analysis, reference is made to "Analytical Chemistry" by Charls, A., Evans, Vol. 44, No. 13 (Nov. 1972) pp 67A–80A.

U.S. Pat. No. 3,881,108 entitled "Ion Microprobe Analyzer", issued in Apr. 29, 1975 to Toshio Kondo and Hifumi Tamura and assigned to the present assignee proposes an electronic aperture technique. According to this proposal, in order to assure uniform etching and eliminate influence of noise components stemming from the periphery of a crater formed by etching, a primary ion beam is scanned stepwise within a predetermined specimen area, and only secondary ions generated from a central portion of the scanned area are detected. In other words, the sampling region is confined within part of the etched region to improve reliability of signal detection.

U.S. Pat. No. 3,494,233 entitled "Ion Microprobe Analyzer", issued on July 8, 1975 to Hifumi Tamura, Toshio Kondo and Kazumitsu Nakamura and assigned to the present assignee proposes a total ion monitoring technique. According to this proposal, a monitoring signal corresponding to intensity of the total secondary ions is detected and the detected intensity of specific secondary ions is divided by the monitoring signal, thereby compensating for fluctuations in the secondary ion intensity due to variations in primary ion current, etching rate, secondary ion collecting rate and the like factor. In other words, fluctuations in signal levels due to variations in analyzing conditions are compensated for improving accuracies of the quantitative analysis.

For presenting results of the ion microanalysis in the direction of depth (depth analysis), secndary ion intensity distribution or specimen composition is preferably presented as a function of the depth. When the etching rate is constant, the depth of analyzed site or location can be determined from etching time and the depth of a crater (etching depth) after the analysis. For measurement of the crater depth after the analysis, a multiple interferrometer, Taylor-Hobson type surface roughness meter or the like instrument may be used. By using a mean sputtering rate obtained by dividing the measured etching depth by time of primary ion beam bombardment, a depth corresponding to each analyzed site can be obtained. In these methods, the measurement of depth must be carried out after completion of the microanalysis, and it is difficult to determine etching depths (analyzed depths) during progress of the analysis. A way of estimating the etching depth during the analysis is available wherein sputtering yield (atoms/ion) is measured in advance and the sputtering rate is calculated from the measured sputtering yield and primary ion bombardment conditions.

It is known that the sputtering yield by the primary ion bombardment depends upon primary ion species, primary ion energy, incident angle, current density and degree of vacuum in an analyzing chamber and that it changes with the element of a specimen and impurity concentration in the specimen. Of these factors, the current density changes in a complicated manner with gas pressure and temperature of an ion source and ion beam size and it is difficult to always place the current density in the same condition. Accordingly, the this method it is difficult to improve the accuracy of estimation of the etching depth. Failure to determine the etching depth during the analysis leads to the need for unnecessarily excessive tolerance and forces extra etching (analysis) of the specimen, resulting in a waste of analysis time and additional cost. Therefore, it is desired to determine the analyzing depth with high accuracies during the analysis.

SUMMARY OF THE INVENTION

An object of this invention is to provide ion microanalysis which permits determination of the analyzed depth during the analysis.

The implanted depth of primary ion beam does not depend upon current density and it can be determined with relatively high accuracies from primary ion species, primary ion energy and substance of the specimen. If the implanted depth of primary ion beam can be detected during the progress of the analysis, it is possible to determine and indicate depths of other locations in the analyzed volume by indexing the implanted depth.

According to one aspect of this invention, there is provided an ion micro-analyzer comprising: means for detecting the intensity of at least one species of secondary ions emitted from a specimen and for generating a monitoring signal corresponding to the intensity; means for processing the monitoring signal and for deriving a correlation between implanted depth of a primary ion beam and etching time; and means for deriving the depth of an analyzed volume on the basis of the correlation.

According to another aspect of this invention, there is provided an ion micro-analysis method comprising the steps of: bombarding the surface of a specimen with a primary ion beam which does not volatilize from the specimen when implanted therein; detecting at least one species of secondary ions carrying information regarding implanted depth of the primary ions and for generating a signal corresponding to the species of secondary ions; deriving from the signal a relation between the implanted depth of the primary ions and etching time; and generating a signal representative of the depth of an analyzed site on the basis of the relation.

The primary ions implanted in the specimen at one moment distribute around a certain implanted depth. In case the primary ions do not volatilize from the specimen, when an integrated value of the implanted primary ions is detected as a function of etching time (as secondary ions), etching rate can be determined on the basis of a correlation between profile of the detected signal and implanted depth of the primary ions. The analyzed depth can be determined from the etching rate and the etching time. When the primary ions are active ions which react with a specimen, all species of secondary ions behave like the primary ions implanted. Accordingly, it is possible to determine the analyzed depth during the analysis by detecting at least one species of the secondary ions.

With the analyzed depth being determined during the analysis, immediate utilization of analysis results is possible to avoid waste analysis, thereby assuring analysis of only a desired volume. Thus, time, labor and cost required for the analysis can be reduced. When the active primary ions are used, the secondary ion signal for detection of the analyzed depth can be obtained from either a signal resulting from mass-analysis of secondary ions or a total secondary ion signal detected from secondary ions not subjected to mass-analysis. Accordingly, without additional analysis procedures, the analyzed depth can be detected simultaneously with the ion micro-analysis.

DESCRIPTION OF THE PREFERRED EMBODIMENTS

Figure 1A:
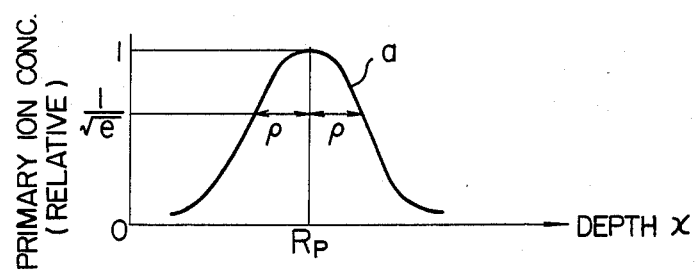
FIGS. 1A to 1E are various graphs useful in explaining the principle of the invention.

FIG. 1A shows a concentration distribution of primary ions in the direction of depth x within a homogeneous specimen substrate when a primary ion beam is implanted in the specimen substrate under the application of a constant accelerating voltage. Actually, the primary ions are neutralized within the specimen but they are still called primary ions herein for simplicity of explanation. The primary ions implanted have a maximum concentration at a depth of $x = Rp$ and distribute around the peak position. The distribution profile may substantially be approximated by a Gaussian distribution, and in FIG. 1A, the standard deviation of the Gaussian distribution is represented by $\rho$. The implanted ions repeat collisions within the specimen substrate to lose energy and eventually, stop moving. Accordingly, the mean depth, as represented by Rp, mainly depends on substance of the specimen, species of the primary ions and accelerating voltage. If the distribution profile shown in FIG. 1A can be detected, it will be possible to set up a criterion of depth. However, in the ion micro-analysis, the distribution profile of FIG. 1A cannot be observed.

Figure 6:
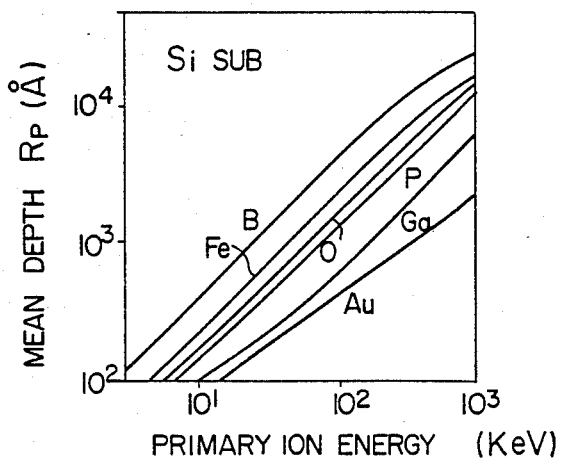
FIG. 6 is a graph showing various implanted depths of primary ions as a function of implantation energy.

FIG. 6 shows the relation between implanted depth Rp and primary ion energy obtained when various species of primary ions are implanted in a silicon substrate.

For more information, reference is made to "Ion Beams with Applications to Ion Implantation" by Robert G. Wilson, John Wiley & Sons, New York, 1973. The depth Rp also changes with substance of the specimen substrate. Generally, the depth Rp is in inverse proportion to the atomic weight of element.

The value of Rp can of course be obtained through actual measurement. In ion implantation in which implanted ions are required to be distributed within a specimen substrate, the accelerating voltage is selected to be a relatively high value (for example, of the order of $10^2$ KeV). In IMA aiming at analysis of secondary ions generated from a specimen substrate, on the other hand, the accelerating voltage for a primary ion beam is selected to be a relatively low value (for example, 10 to 20 KeV) to set a small implanted depth Rp. During the IMA, the specimen surface is sputtered (etched) by the primary ion beam and as a result, it moves gradually deeper during the progress of the IMA.

Figure 1B:
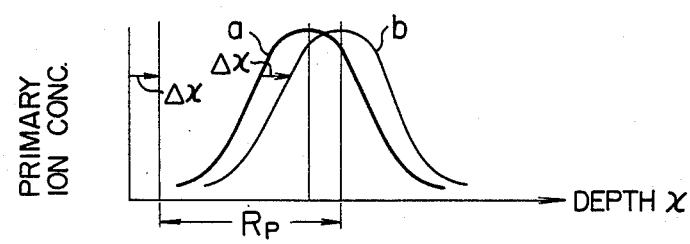

A change in distribution of the primary ion concentration within the specimen as shown in FIG. 1B attends the etching of the specimen surface. At the beginning of the analysis ($t = t_0$), the specimen surface coincides with a plane represented by $x = 0$ and primary ions initially implanted distribute around a center of $x = Rp$ as shown at curve a. Assuming that the specimen surface is etched by $\Delta x$ when a time $\Delta t$ has elapsed ($t = t_0 + \Delta t$), the specimen surface moves by $x = \Delta x$ and primary ions implanted in the specimen distribute around a center of $x = \Delta x + Rp$ as shown at curve b. Curves a and b have the same profile with their centers shifted from each other. Accordingly, instantaneous distributions as shown at curves a and b in FIG. 1B are totalized to provide the distribution of the total primary ions implanted in the specimen. Therefore, direct detection of the FIG. 1A distribution profile during the analysis is impossible.

Figure 1C:
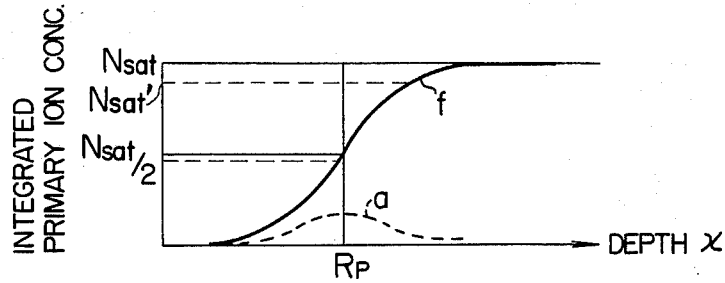

As the analysis proceeds, the distribution of the integrated concentration of the primary ions implanted in the specimen as shown in FIG. 1C can be obtained. For comparison, the distribution curve a of FIG. 1A is schematically illustrated as a dotted curve. The instantaneous concentrations of the primary ions at instantaneous implantation as shown at the curves a and b in FIG. 1B are integrated to provide the distribution f as shown in FIG. 1C. Thus, the distribution profile f has a correlation with the distribution profile a of FIG. 1A. The distribution profile of FIG. 1C is removed of the peak which appears at $R_p$ in FIG. 1A and it gradually increases and eventually becomes saturated. Then, it may be conceivable to detect a saturation point on the FIG. 1C distribution profile in order to estimate the depth. However, the saturation point is not always related definitely to the implantation depth $R_p$ and actually, the saturation point is difficult to detect with high accuracies. Especially, it is extremely difficult to accurately detect the saturation point on a gradual saturation signal superimposed with noise and drift.

It has been found that a rapidly changing region of the FIG. 1C distribution profile has a relatively highly accurate correlation with the FIG. 1A distribution profile, especially at $R_p$. The Gaussian distribution is symmetric with respect to the peak and the position (depth) $R_p$ for the peak concentration in FIG. 1A corresponds to a position (depth) at which the concentration becomes Nsat/2 which is just half the saturated value (concentration), Nsat. Even if the instantaneous distribution profile of FIG. 1A deviates from the Gaussian distribution, the relation between the saturated concentration level and a concentration level at $R_p$ can readily be determined. Therefore, the value of $R_p$ can be determined by detecting a position (depth) at which a relative concentration with respect to the saturated concentration reaches a predetermined level. Other positions than the one corresponding to the depth $R_p$ may also be chosen as the position to be detected. FIG. 1C shows a way of determining the depth $R_p$ as the position corresponding to Nsat/2 after detection of the saturated concentration Nsat. After all, the relation between time axis and depth axis can be determined by determining a time at which the etching depth becomes $R_p$. In this case, it should be noted that relatively high accuracies are not required for the detection of saturation. In other words, if the saturated concentration is judged as Nsat', a depth $R_p'$ determined from Nsat'/2 differs from the $R_p$ by merely a slight amount. Accordingly, knowledge of the location of depth $R_p$ or the depth of the analyzed site can be relatively accurate even when S/N ratio of the detected signal is poor or drift components are contained in the detected signal.

Further, the peak position of FIG. 1A corresponds to a position in FIG. 1C where the first order derivative of the profile takes a maximum and where the second order derivative of the profile becomes zero. Also, the mid point of such two points where the relative distribution profile of FIG. 1A takes a fixed value, e.g. $1/\sqrt{e}$, corresponds to the peak position. The points where the relative distribution profile of FIG. 1A takes $1/\sqrt{e}$ in the case of Gaussian distribution are the points where the second order derivative of the profile of FIG. 1C forms a positive and a negative peak. The position of $R_p$ can be detected by utilizing these and other characteristic points of the distribution of FIG. 1C.

In the previous description, the implanted primary ions are detected in the form of the secondary ions. For assuring the above behavior of the primary ions, the primary ions should be non-volatile. Namely, the primary ions may be active ions, such as oxygen ions ($O_2^+$), which react with substance of the specimen or non-volatile ions, for example metal ions such as In, Ga or Au ions, which remain unvaporized within the specimen.

When the primary ions are active ions such as oxygen ions ($O_2^+$), ion species other than the primary ion species can be detected without impairing the above effect as obtained with the primary ion species.

Figure 1D:
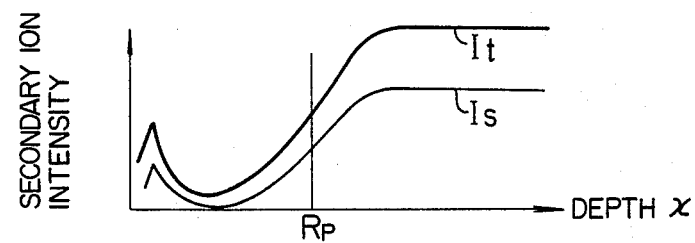

Illustrated in FIG. 1D are results of analysis showing distributions of intensity $I_t$ of the total secondary ions and intensity $I_s$ of specific mass secondary ions in the direction of depth when oxygen ions are used as the primary ions. The results in FIG. 1D show a similar behavior to the primary ion concentration of FIG. 1C, in this case, the oxygen concentration within the specimen. Accordingly, the secondary ions to be detected may be the total secondary ions or one or more than one species of secondary ions. For example, when analyzing a silicon substrate doped with impurities, Si ions may be monitored.

Figure 1E:
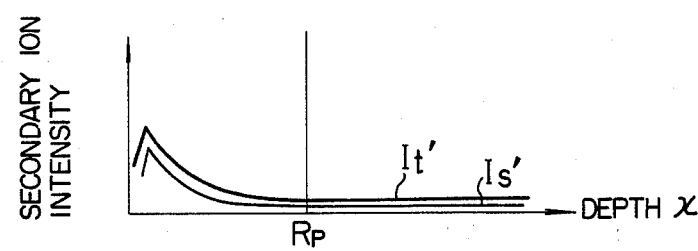

When argon ions are used as the primary ions with the same specimen as that for FIG. 1D, results of analysis lead to distributions of intensity $I_t'$ of the total secondary ions and intensity $I_s'$ of specific-mass secondary ions as shown in FIG. 1E, which distributions are totally different from those of FIG. 1D. In FIG. 1E, neither the intensity $I_t'$ of the total secondary ions nor the intensity $I_s'$ of any specific secondary ions exhibit saturation and the position of $R_p$ cannot be determined.

When metal ions such as Au, In or Ga ions are used as the primary ions, the signal of the secondary ions of an element constituting the specimen behaves as shown in FIG. 1E whereas the implanted primary ions (of Au, In or Ga) per se behave as shown in FIG. 1C, so that the position of $R_p$ can be determined.

Peaks near the surface as shown in FIGS. 1D and 1E are due to an oxide layer or adsorbed oxygen on the specimen surface and act as noise components in the measurement of the depth. However, since these peaks usually occur at a very shallow depth of below 20 to 30 Å, the detecting system may readily be made insensitive to these peaks.

Figure 2:
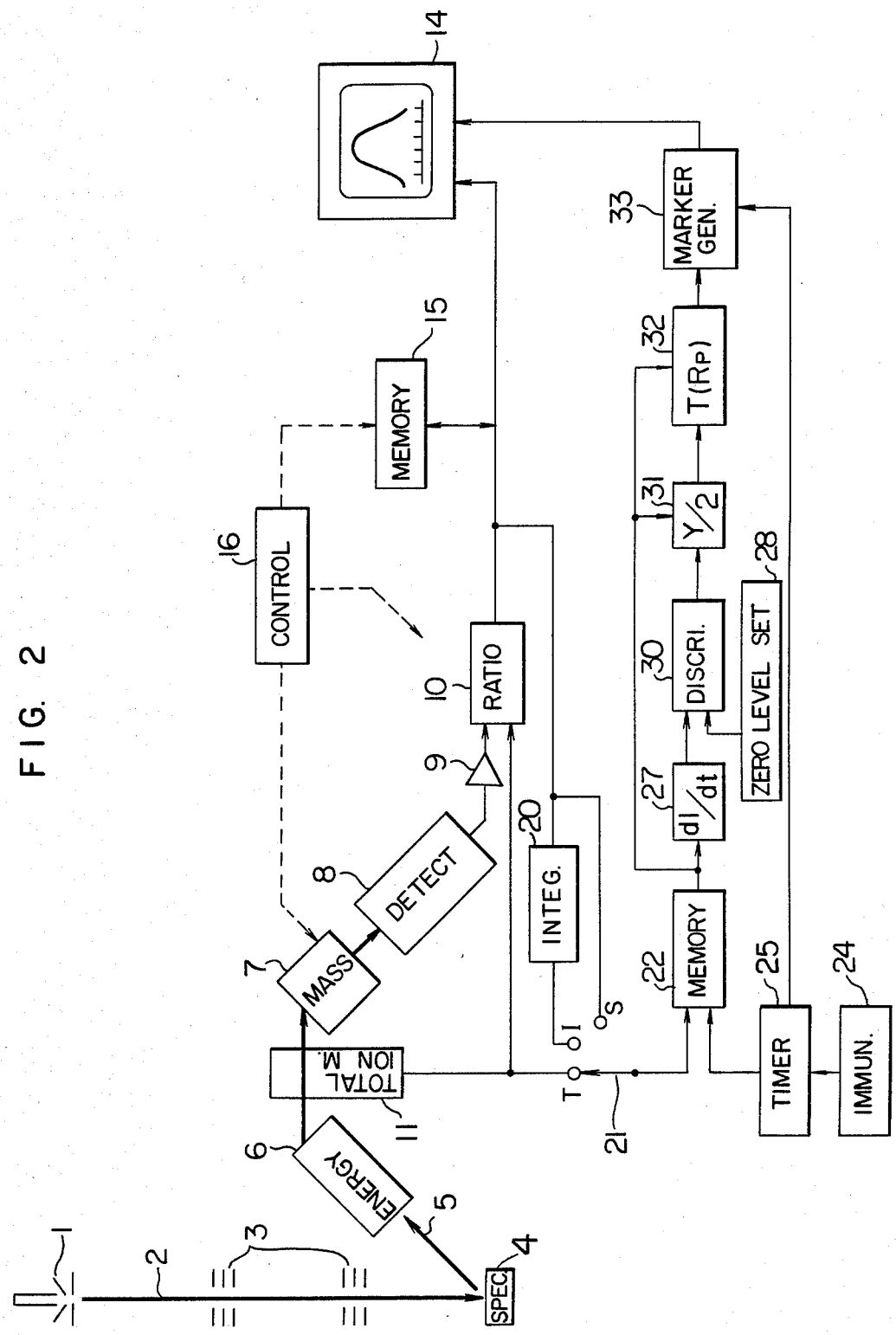
FIG. 2 is a block diagram of an ion microanalyzer (IMA) embodying the invention.

FIG. 2 shows an ion micro-analyzer (IMA) embodying the invention. A beam 2 of primary ions generated and accelerated in an ion source 1 is focused by lenses 3 and bombards the surface of a specimen 4. Secondary ions 5 generated from the specimen are passed through an energy analyzer 6 such as an electrostatic sector, mass-analyzed by a mass analyzer 7 such as a magnetic sector or a quadrupole mass-analyzer, and detected by a detector 8 such as a combination of ion-electron converter and electron multiplier or channeltron. An output of the detector 8 is supplied to one input of a ratio circuit 10 via an amplifier 9. The total ion monitor 11 disposed on the output side of the energy analyzer 6 includes a converter, which also serves as an inlet slit for the mass-analyzer 7, so as to supply a total ion intensity signal representative of intensity of the total ions to the ratio circuit 10. This ratio circuit 10 produces a secondary ion signal which is compensated for fluctuations in the total ion intensity, but is not always necessary. The secondary ion signal from the amplifier 9 or the ratio circuit 10 is supplied to an output device 14 such as a cathode ray tube or a pen recorder to indicate a signal waveform thereon. The secondary ion signal may also be once stored in a memory 15 to be reproduced arbitrarily. A control circuit 16 controls mass-scanning in the mass-analyzer 7 for effecting simultaneous detection of multiple elements. The above construction is well known in the art and for details, reference may be made to the articles and U.S. patents mentioned previously.

The output signal of the ratio circuit 10 or the amplifier 9 is coupled via an integrator 20 to a contact I and directly to a contact S of a switch 21. Another contact T of the switch 21 is connected to receive the output signal of the total ion monitor 11. The contact T provides a monitoring signal for good S/N ratio which can be provided parallelly with the mass-analysis signal. When the ratio circuit 10 is used, the output thereof is compensated for the fluctuations of primary ion intensity, etc. when the total ion monitor 11 and/or the ratio circuit 10 are dispensed with, the integration circuit 20 integrates the mass-analyzed signal from the amplifier 9 with respect to the mass and provides a monitoring signal with a high S/N ratio. When the output of the ratio circuit 10 is integrated, there is provided a compensated monitoring signal with a high S/N ratio. When a metal is employed as the primary ion species, the secondary ion intensity for that metal species should be used as the monitoring signal without intervening the integrator 20. Also, a secondary ion intensity of one species such as one for the matrix substance may be used as the monitoring signal. It will be apparent that at least one monitoring signal is necessary and part of the constituents of FIG. 2 may be dispensed with. The switch 21 selects one of the three signals and supplies the selected signal to a memory 22 as a monitor signal. The memory 22 may be included in the memory 15. An immune zone setting circuit 24 controls a timer 25 which supplies a sampling signal to the memory 22. The immune zone setting circuit 24 prevents sampling of the peak signals generated near the surface layer. In this manner, the secondary ion intensity signal monitored as a function of etching time is stored in the memory 22. The secondary ion monitoring signal from the memory 22 is converted of differentiated at a differential detector circuit 27 into a differential coefficient (first order derivative) $dI/dt$ which is compared at a discriminator circuit 30 with a reference value of zero level from a derivative setting circuit 28 for setting the zero level of the derivative. When the differential coefficient $dI/dt$ falls below the reference level, the secondary ion signal is judged as saturated and a monitoring signal level (saturated level) Y at this time is divided in a divider 31 to provide a level Y/2 which is half the saturated level and supplied to a converter 32. The converter 32 compares the monitoring signal level stored in the memory 22 with the level Y/2 to detect a time $T(R_p)$ at which the monitoring signal coincides with the level Y/2. Here, the etching time for etching a depth $R_p$ is detected. At the interval of the reference time $T(R_p)$, a marker generator circuit 33 produces a marker signal (or the time axis) representative of a depth which is supplied to the output device 14. In this manner, an analysis signal accompanied by a scaling of depth is indicated on the output device 14. It will be apparent that once the relation between the etching time and the analyzing depth is determined various marker signals representative of depth can be generated as well as the interval of $R_p$.

The secondary ion signal for detection of the depth may be a total secondary ion intensity or a specific secondary ion intensity. The detector for the total secondary ions may be disposed at the inlet of the energy analyzer or that of the mass analyzer so that secondary ions not collected by the analyzer may be utilized. In an IMA having a total secondary ion monitor for compensating the secondary ion signal intensity for the fluctuation of primary ion beam, etc., a monitoring signal for compensation use can be utilized. Such a total secondary ion signal can be obtained independently of the mass analysis signal and advantageously, it has no adverse influence upon the measurement. Further, a sufficient signal intensity can readily be obtained.

When metal ions are used as the primary ions, it is indispensable for the depth detection to use the detection signal of specific secondary ions, and this detection signal can be utilized for an IMA with or without total ion monitor 11 and ratio circuit 10. With the metal ions being used as the primary ions, the metal ion species can be detected as one species of the secondary ions and used for the depth measurement. With active ions, any secondary ion species can be used. In measuring small quantities of impurities in a matrix, an element of the matrix is usually measured and the detection signal of the matrix element can be used for the depth monitoring. In a measurement in which multiple elements are scanned, it is possible to enhance the S/N ratio of the depth monitoring signal by integrating the secondary ion signal by the integrator 20.

Figure 3:
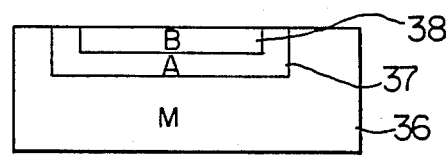
FIG. 3 is a sectional view showing one example of a specimen to be analyzed.

FIG. 3 illustrates a substrate 36 of an element M having a deep ion (A) implanted region 37, and a shallow ion (B) implanted region 38 formed within the region 37.

Figure 4:
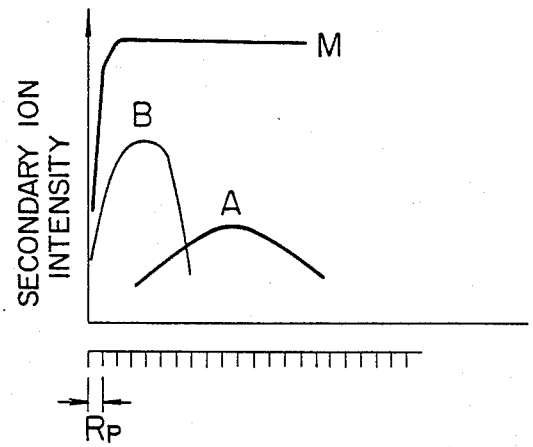
FIG. 4 is a graphic representation showing results of analysis of the FIG. 3 specimen with the FIG. 2 IMA.

The substrate is subjected to ion microanalysis using oxygen $O_2^+$ as primary ions with the analyzer of FIG. 2 to obtain measurement results as shown in FIG. 4. Of curves M, A and B representative of intensity of the secondary ions, the curve M is used for the depth monitoring. More particularly, in the FIG. 2 analyzer, the switch 21 is transferred to the contact S, and the ion intensity represented by curve M is applied to the memory 22 through the control circuit 16. The derivative detecting circuit 27 provides a time derivative of this ion intensity. This derivative rises rapidly and thereafter decreases to approach zero. When the decreasing derivative falls below a predetermined level set by the level setter 28, the discriminator circuit 30 judges that the secondary ion intensity is saturated and based on secondary ion intensity Msat at this time, the divider 31 produces intensity Msat/2 which is half the intensity Msat. The time-depth converter 32 responsive to the secondary ion intensity signal stored in the memory 22 detects a time $T(R_p)$ at which the secondary ion intensity coincides with Msat/2. Each time the reference time interval $T(R_p)$ elapses, the marker generator 33 produces a marker signal which in turn is indicated on the output device 14. Where results of the measurement are once stored in a memory and the stored data is then indicated on a CRT or chart recorder, the depth may readily be converted into an arbitrary graduation or scale and indicated. In FIG. 4, the graduation is in units of a time division from $t=0$ to $T(R_p)$.

According to experimental results, when $O_2^+$ ions are implanted in a Si substrate with an energy of 8 KeV, the implanted depth $R_p$ is about 100 Å. The analysis depth can be observed directly if the analysis time is graduated in terms of the value of $R_p$. Generally, since the analysis in the direction of depth is carried out up to a depth of about 1,000 to 10,000 Å, the graduation in units of about 100 Å is satisfactory. In this manner, the depth of the analyzing site can be quantitatively determined during the analysis.

For example, when it is desired to measure the impurity distribution between the surface and a depth of 4000 Å on a great number of specimens, unwanted analysis can be avoided by accurately finding the time at which the etching reaches 4000 Å, thereby reducing analysis time, labor and cost of analysis. In comparison with estimation of the depth on the basis of prediction of the etching rate according to the prior art, the present invention which calculates the depth on the basis of reliable ion implanted depth can improve measuring accuracies of the depth.

Figure 5A:
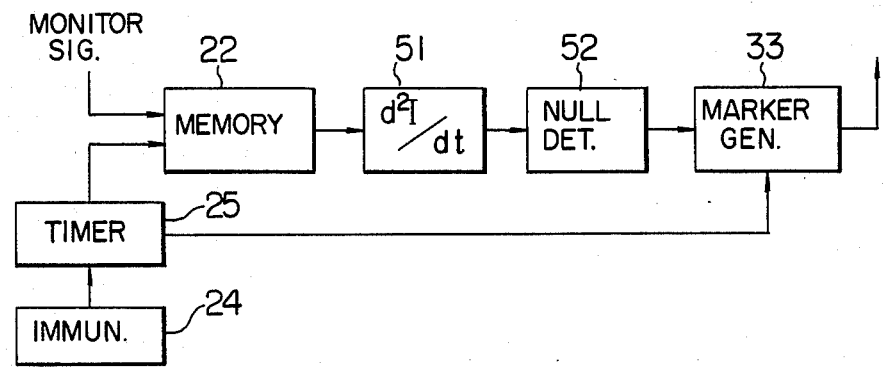
FIGS. 5A and 5B are partial block diagrams of IMA according to further embodiments of the invention.
Figure 5B:
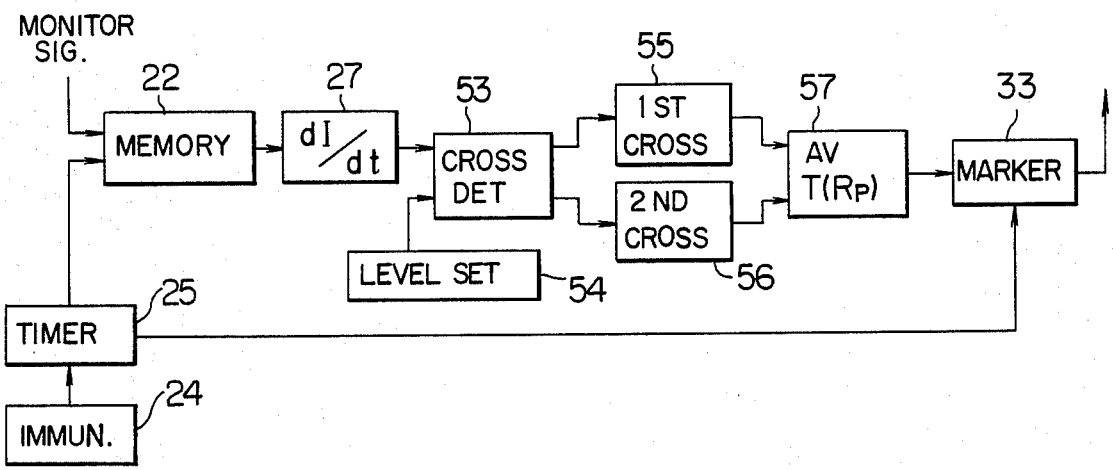

FIGS. 5A and 5B partially show other embodiments of the IMA according to the invention. In these Figures, similar parts as those of FIG. 2 are designated by similar reference numerals.

With reference to FIG. 5A, an output of a memory 22 is supplied to a second order derivative circuit 51 at which the intensity of secondary ions is subjected to a second order differentiation. A null detector 52 detects a time at which a second order derivative intersects the zero level. Namely, the null detector 52 detects an inflection point of the secondary ion intensity waveform as shown in FIG. 1C or 1D. When the primary ion distribution is symmetrically peaked as shown in FIG. 1A, the inflection point on the curve of FIG. 1C approximately corresponds to the center of the FIG. 1A distribution. Accordingly, with a simplified construction, the implanted depth $R_p$ can be determined. For in-situ monitoring, the memory 22 may be dispensed with. The simplified construction of the second order derivative circuit 51 and a null detector 52 may be added to the FIG. 2 to provide a fail-safe arrangement wherein the output of the null detector 52 controls the output of the converter 32 of FIG. 2.

With reference to FIG. 5B, in a further embodiment, the derivative of a signal representative of secondary ion intensity from a differential circuit 27 is supplied to a cross detector 53. A level setting circuit 54 sets a signal level and a signal detected at times when the differential signal intersects the signal level is supplied to first and second cross registers 55 and 56. The level setting circuit 54 may exemplarily be constructed to detect the peak of a second order derivative of the secondary ion intensity and supply the value of the first order derivative dI/dt at this time as the set level. The first and second cross registers respectively input a time at which the increasing first order derivative intersects the set level and a time at which the decreasing first order derivative intersects the set level. When the second cross register receives the input signal, the contents of the first and second cross registers are added together (and divided by two) at an implanted depth detector circuit 57 to supply to a marker generator 33 an etching time T ($R_p$) corresponding to the implanted depth $R_p$ or a doubled time 2 T ($R_p$). Thus, two points at which the FIG. 1A distribution intersects a certain level are determined and the implanted depth $R_p$ is obtained in the form of the average of the two points. The memory 22 may be dispensed with for in-situ monitoring similar to the case of FIG. 5A.

While the invention has been described with reference to preferred embodiments thereof, it will be understood by those skilled in the art that the invencion is not limited to the embodiments and various changes, modifications and combinations may be made without departing from the spirit and scope of the invention.

We claim:

1. An ion micro-analyzer (IMA) in which the surface of a specimen is bombarded with a primary ion beam and secondary ions generated thereby are mass-analyzed, comprising:
   means for generating a primary ion beam and bombarding the surface of a specimen with the primary ion beam;
   means for detecting at least one species of secondary ions emitted from the specimen, and generating a monitoring signal corresponding to the species of secondary ions;
   means for processing the monitoring signal to provide a relation between an implanted depth of the primary ions and an etching time corresponding to the implanted depth on the basis of a profile of the monitoring signal; and
   means for providing an output indicative of a depth of an analyzed site in the specimen on the basis of said relation.

2. An ion micro-analyzer according to claim 1, wherein said processing means includes a processing circuit for detecting a mean position of distribution of primary ions implanted during an initial stage of the analysis.

3. An ion micro-analyzer according to claim 2 wherein said processing means includes a circuit for obtaining a time derivative of at least first order of the monitoring signal.

4. An ion micro-analyzer according to claim 1 wherein said processing means includes a circuit for detecting substantial saturation of the monitoring signal, a circuit for dividing a saturated level of the monitoring signal by a predetermined factor, a circuit for obtaining a reference analysis time at which the monitoring signal reaches the divided signal level, and said means for providing a depth output including a circuit for converting an analysis time into an analysis depth on the basis of the reference analysis time to produce a depth signal.

5. An ion micro-analyzer according to claim 1 wherein said detecting and generating means includes a detector for detecting intensity of secondary ions from those secondary ions not subjected to the mass analysis.

6. An ion micro-analyzer according to claim 1 wherein said detecting and generating means includes an integrator for integrating a signal representative of intensity of secondary ions subjected to the mass analysis with respect to mass.

7. A method for mass-analysis, in which the surface of a specimen is bombarded with a primary ion beam and secondary ions generated thereby are mass-analyzed, comprising the steps of:
   bombarding the surface of a specimen with a beam of non-volatile primary ions which when implanted in the specimen, do not volatalize and stay in the specimen;
   detecting ion intensity of at least one species of the secondary ions emitted from the specimen, said secondary ion intensity having a time profile carrying information regarding an implanted depth of the primary ions;
   detecting from the time profile of said secondary ion intensity a relation between the primary ion implanted depth and an etching time corresponding thereto; and
   generating a signal representative of a depth of an analyzed site on the basis of said relation.

8. A method for mass-analysis according to claim 7 wherein said step of detecting the relation including determining a time derivative of at least first order of said secondary ion intensity.

9. A method for mass-analysis according to claim 7 wherein said non-volatile ions comprise active ions which react with the specimen.

10. A method for mass-analysis according to claim 7 wherein said non-volatile ions comprise metal ions.

11. An ion micro-analyzer according to claim 1, wherein said detecting and generating means includes means for generating at least two different monitor signals and a switch for selecting one of said at least two different monitor signals.

12. An ion micro-analyzer according to claim 1, further comprising an immunity circuit for rendering the processing means insensitive to a change in the monitoring signal occurring within a predetermined time period.

13. An ion micro-analyzer according to claim 1, wherein said processing means includes a circuit for obtaining a second order derivative of the monitoring signal.

14. An ion micro-analyzer according to claim 13, wherein said processing means further includes a level detector means connected to the output of said second order derivative circuit for obtaining a point at which said second order derivative crosses a predetermined level.

15. An ion micro-analyzer according to claim 3, wherein said processing means further includes a level setter means for setting a level and a cross detector for detecting the point at which said time derivative crosses said level.

16. An ion micro-analyzer according to claim 1, wherein said processing means includes a derivative circuit for producing a first order derivative of the monitoring signal, a level setter means for setting a level, a crossing detector for detecting a pair of points at which said first order derivative crosses said level, register means for storing a pair of times at which said crossing detector generates outputs, and an averaging circuit for obtaining an average of said times.

17. An in-situ monitoring system for monitoring an etched depth of a specimen in an ion micro-analyzer which bombards the specimen with a primary ion beam and mass-analyzes secondary ions emitted from the specimen, comprising:

secondary ion detector means for detecting secondary ions emitted from the specimen and producing a monitoring signal indicative of a profile of the time change in the intensity of the secondary ions;

derivative circuit means for taking a time derivative of said monitoring signal;

reference value circuit means for generating a reference value signal;

time scale generator means for detecting a characteristic point in the profile of said monitoring signal, based on said derivative and said reference value, and for generating a time scale signal based on a time at which said characteristic point appears.

18. An in-situ monitoring system according to claim 17, wherein said time scale generator means includes marker circuit means for repeatedly generating a marker signal at an interval determined by said time.

19. An in-situ monitoring system according to claim 17, wherein said characteristic point is at least one of (a) a point at which the monitoring signal relative to a saturation value takes a predetermined level, (b) a point at which the first order derivative of the monitoring signal takes a maximum, (c) a point at which the second order derivative of the monitoring signal becomes substantially zero, and (d) a mid-point of two points at which the first order derivative of the monitoring signal takes a predetermined level.

20. An in-situ monitoring system according to claim 17, further comprising display means for displaying the data of analysis with the time scale indicative of the depth in the specimen.

* * * * *